United States Patent
von Malm

(10) Patent No.: US 7,838,876 B2
(45) Date of Patent: Nov. 23, 2010

(54) OPTOELECTRONIC SEMICONDUCTOR DEVICE IN WHICH CURRENT SPREADING LAYER OF SOL GEL MATERIAL MIXED WITH NANOPARTICLES IS MIXED WITH WAVELENGTH CONVERSION DYES

(75) Inventor: Norwin von Malm, Pettendorf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 391 days.

(21) Appl. No.: 11/527,229

(22) Filed: Sep. 26, 2006

(65) Prior Publication Data

US 2007/0080361 A1    Apr. 12, 2007

(30) Foreign Application Priority Data

Sep. 28, 2005   (DE) ............... 10 2005 046 450

(51) Int. Cl.
  H01L 33/00   (2010.01)
  H01L 29/10   (2010.01)
  H01L 29/12   (2010.01)
(52) U.S. Cl. ................ 257/43; 257/82; 257/98; 257/451; 257/E33.06; 257/E33.061; 257/E33.062; 257/E33.063; 257/E33.064; 257/E33.065
(58) Field of Classification Search .......... 257/43, 257/82, E33.06–E33.065, 98, 451
See application file for complete search history.

(56) References Cited

U.S. PATENT DOCUMENTS

| | | | |
|---|---|---|---|
| 5,708,296 A | 1/1998 | Bhansali | |
| 6,066,861 A | 5/2000 | Höhn et al. | |
| 6,669,866 B1 | 12/2003 | Kummer et al. | |
| 6,847,162 B2 | 1/2005 | Duggal et al. | |
| 6,885,412 B2 * | 4/2005 | Ohnishi et al. | 349/72 |
| 7,045,956 B2 | 5/2006 | Braune et al. | |
| 7,078,732 B1 | 7/2006 | Reeh et al. | |
| 2003/0052318 A1 * | 3/2003 | Choi et al. | 257/43 |
| 2004/0075100 A1 | 4/2004 | Bogner et al. | |
| 2005/0093008 A1 * | 5/2005 | Suehiro et al. | 257/98 |
| 2005/0133809 A1 | 6/2005 | Song et al. | |
| 2006/0091787 A1 * | 5/2006 | Kabay et al. | 313/501 |

(Continued)

FOREIGN PATENT DOCUMENTS

DE    10 2005 012 953    8/2006

(Continued)

OTHER PUBLICATIONS

Ping Yang, Meng Kai Lu, Fan Qing Meng, Chun Feng Song, Dong Xu, Duo Rong Yuan, Zi Ping Ai, A novel luminescent property from composite of ZnS nanocrystallites and organic chromophore molecules, Optical Materials, vol. 27, Issue 1, Oct. 2004, pp. 103-107.*

(Continued)

*Primary Examiner*—Phat X Cao
*Assistant Examiner*—Diana C Garrity
(74) *Attorney, Agent, or Firm*—Cohen Pontani Lieberman & Pavane LLP

(57) ABSTRACT

An optoelectronic semiconductor chip comprises a radiation passage area (2d), to which is applied a current spreading layer (4) containing particles (4b) of a wavelength conversion material. Furthermore, a method for producing such a semiconductor chip and also a device comprising such a semiconductor chip are specified.

16 Claims, 2 Drawing Sheets

U.S. PATENT DOCUMENTS

2007/0001182 A1* 1/2007 Schardt et al. ............... 257/98
2007/0128905 A1* 6/2007 Speakman ................. 439/161

FOREIGN PATENT DOCUMENTS

| EP | 0 877 099 A1 | 3/1998 |
| EP | 877099 A1 * | 11/1998 |
| EP | 1 439 585 A1 | 1/2003 |
| EP | 1 473 784 A2 | 4/2004 |
| EP | 1 439 585 | 7/2004 |
| EP | 1 548 852 A2 | 12/2004 |
| JP | 11 087778 | 3/1999 |
| JP | 2002-164576 | 6/2002 |
| JP | 2002 164576 | 6/2002 |
| WO | WO 97/50123 | 12/1997 |
| WO | WO 97/50132 | 12/1997 |
| WO | WO 98/12757 | 3/1998 |
| WO | WO 01/08452 A1 | 2/2001 |
| WO | WO 02/084749 A2 | 10/2002 |
| WO | WO 03/093393 | 11/2003 |
| WO | WO 2004/088200 A2 | 10/2004 |
| WO | WO 2006/049146 | 5/2006 |

OTHER PUBLICATIONS

International Standard ISO 9276-2, First Edition, pp. 1-12, Apr. 1, 2001.

I. Schnitzer et al., "30% external quantum efficiency from surface textured, thin-film light-emitting diodes", Appl. Phys. Letter, vol. 63, No. 16, pp. 2174-2176, Oct. 18, 1993.

Spanhel, et al., "Semiconductor Clusters in the Sol-Gel Process: Quantized Aggregation, Gelation, and Crystal Growth in Conecentrated ZnO Colloids", Journal American Chemical Society, vol. 113, No. 8, pp. 2826-2833, 1991.

M. Hilgendorff, "Von Zinkoxidkolloiden und nanokristallinen transparenten elektrisch leitfähigen Elektroden", Universität Würzberg, 1998.

Search Report dated Mar. 30, 2008 issued for the corresponding European Patent Application No. EP 06 01 9686, and an English translation of the relevant portions.

* cited by examiner

OPTOELECTRONIC SEMICONDUCTOR DEVICE IN WHICH CURRENT SPREADING LAYER OF SOL GEL MATERIAL MIXED WITH NANOPARTICLES IS MIXED WITH WAVELENGTH CONVERSION DYES

RELATED APPLICATIONS

This patent application claims the priority of German patent application no. 10 2005 046 450.5 filed Sep. 28, 2005, the disclosure content of which is hereby incorporated by reference

FIELD OF THE INVENTION

An optoelectronic semiconductor chip, and optoelectronic device comprising such a semiconductor chip, and a method for producing such an optoelectronic semiconductor chip are specified.

SUMMARY OF THE INVENTION

One object of the present invention is to provide an optoelectronic semiconductor chip which can be produced in a particularly cost-effective manner.

A further object is to provide an optoelectronic device comprising such a semiconductor chip.

Yet another object is to provide a method for producing such an optoelectronic semiconductor chip.

In accordance with at least one embodiment of the optoelectronic semiconductor chip, the optoelectronic semiconductor chip has a radiation passage area. The radiation passage area is an area through which electromagnetic radiation can enter into the optoelectronic semiconductor chip or through which optoelectronic radiation is coupled out from the semiconductor chip. In other words, radiation that interacts with the chip passes through the radiation passage area. The radiation passage area is therefore a radiation entrance or exit area of the optoelectronic semiconductor chip.

The radiation passage area is preferably provided by at least one part of the surface of the optoelectronic semiconductor chip. By way of example, the radiation passage area may be provided by a part of the main area of the optoelectronic semiconductor chip or comprise a main area of the optoelectronic semiconductor chip.

In accordance with at least one embodiment of the optoelectronic semiconductor chip, the radiation passage area is in contact with a current spreading layer. That is to say, for example, that the current spreading layer covers the radiation passage area at least in places and is thereby suitable for impressing electric current through the radiation passage area into the semiconductor chip.

By way of example, the current spreading layer is in this case applied to the radiation passage area. "Applied" means that the current spreading layer is preferably not integrated monolithically into the semiconductor chip. That is to say that the current spreading layer is preferably not grown epitaxially together with another semiconductor layer of the optoelectronic semiconductor chip, for example in an epitaxy reactor, rather the current spreading layer is preferably applied to the radiation passage area of the optoelectronic semiconductor chip subsequently, that is to say after the growth of the optoelectronic semiconductor chip has been concluded. As an alternative, it is also possible for the semiconductor chip to be applied to the current spreading layer by its radiation passage area.

The current spreading layer designates an electrically conductive layer. The current spreading layer is suitable for distributing an electric current, injected for example by means of a connection location (bonding pad), as uniformly as possible over the radiation passage area of the optoelectronic semiconductor chip. The connection location may be applied to a part of the current spreading layer for this purpose. The electric current distributed over the radiation passage area of the optoelectronic semiconductor chip in this way then serves for the generation of radiation, for example, in the optoelectronic semiconductor chip.

The current spreading layer preferably has a good transverse conductivity. That is to say that the conductivity of the layer in directions that run parallel to the radiation passage area is particularly high. Furthermore, the current spreading layer preferably has a good conductivity in a direction perpendicular or substantially perpendicular to the radiation passage area. Thus, the electric current can be conducted particularly well to the radiation passage area of the chip from that surface of the current spreading layer which is remote from the radiation passage area, and be distributed over the entire radiation passage area.

The current spreading layer is preferably applied directly to the radiation passage area of the optoelectronic semiconductor chip. That is to say that it preferably directly adjoins an external area—grown epitaxially for example—of the optoelectronic semiconductor chip. In this case, the current spreading layer is preferably transparent at least to a part of the electromagnetic radiation which emerges from the optoelectronic semiconductor chip through the radiation passage area or enters into the optoelectronic semiconductor chip through the radiation passage area. The optical transparency of the current spreading layer in the visible spectral range is preferably at least 90 percent.

In accordance with at least one embodiment of the optoelectronic semiconductor chip, the current spreading layer contains a wavelength conversion material. In this case, the wavelength conversion material designates a material which is suitable for absorbing electromagnetic radiation having a first wavelength or in a first wavelength range and re-emitting electromagnetic radiation having a second wavelength or in a second wavelength range. In this case, the electromagnetic radiation having the second wavelength or in the second wavelength range may be radiation having a shorter wavelength than that of the first wavelength range. Particularly preferably, however, the converted radiation is longer-wave radiation than that having the first wavelength or in the first wavelength range.

The wavelength conversion material is preferably present in particle form or the current spreading layer contains particles containing a wavelength conversion material. That is to say that the current spreading layer preferably contains particles of a wavelength conversion material.

In accordance with at least one embodiment of the optoelectronic semiconductor chip, the optoelectronic semiconductor chip has a radiation passage area, to which is applied a current spreading layer containing particles comprising a wavelength conversion material.

In this case, the optoelectronic semiconductor chip is based on the idea, inter alia, that the introduction of wavelength conversion material directly into the current spreading layer enables the optoelectronic semiconductor chip to be produced in a particularly simple manner since one production step—namely the application of a wavelength conversion layer separate from the current spreading layer—can be obviated. Furthermore, the optoelectronic semiconductor chip is based on the insight, inter alia, that the particles of the wavelength conversion material can suppress multiple reflections of electromagnetic radiation at the current spreading layer since they bring about, inter alia, a roughening of the surface of said layer. In this way, it is advantageously possible to increase the probability of coupling out electromagnetic radiation from the optoelectronic semiconductor chip through the current spreading layer. Moreover, a current spreading layer with wavelength conversion material enables the wavelength conversion material to be applied as close as possible to the radiation passage area of the semiconductor chip. As a result, the degree of conversion of the emerging radiation can be increased and/or the color impression of mixed radiation of electromagnetic radiation in the first and second wavelength ranges is particularly uniform and independent of the viewing angle.

In accordance with at least one embodiment of the optoelectronic semiconductor chip, the current spreading layer imparts an adhesion between the particles of the wavelength conversion material and the radiation passage area of the optoelectronic semiconductor chip. That is to say that the current spreading layer adheres to the radiation passage area and the particles of the luminescence conversion material adhere to the current spreading layer. The current spreading layer thereby imparts a mechanical retention of the particles of the wavelength conversion material on the radiation passage area.

In this case, particles of the wavelength conversion material may be in direct contact with the radiation passage area and/or material of the current spreading layer is situated between the particles and the radiation passage area.

In other words, the current spreading layer can be used in the sense of an adhesive or adhesion agent with the aid of which the particles of the wavelength conversion material are adhesively bonded onto the radiation passage area of the semiconductor chip. At the same time, the current spreading layer serves for distributing electric current over the entire surface of the optoelectronic semiconductor chip which serves as the radiation passage area. This results in the optoelectronic semiconductor chip being energized as uniformly as possible.

In accordance with at least one embodiment of the optoelectronic semiconductor chip, the layer thickness of the current spreading layer is less than the average diameter of the particles of the wavelength conversion material at least in places. In this case, the layer thickness of the current spreading layer at a specific location of the layer is given by the shortest connection from a point on one main area of the current spreading layer to the opposite main area of the current spreading layer.

The average diameter of the particles of the wavelength conversion material is preferably measured as average particle diameter d50 in Q0. In this case, the expression "measured as d50 in Q0" denotes the median of the grain diameter of the wavelength conversion material, which is determined from a cumulative volume or mass distribution of the particles that are measured. For the definition of this expression, reference is also made to the international standard ISO 9276-2, the disclosure content of which is incorporated by reference.

The average diameter of the particles of the wavelength conversion material is preferably between 1 and 20 micrometers. In this case, it is also possible, in particular, for the current spreading layer to contain particles of different wavelength conversion materials which may in each case have different average grain diameters. Preferably, the average grain diameter of each of the particles used is greater than the minimum layer thickness of the current spreading layer at least in places.

Particularly preferably, the average particle diameter of the wavelength conversion material is also greater than the average layer thickness of the current spreading layer. That is to say that the layer thickness of the current spreading layer averaged over the entire current spreading layer is then less than the average particle diameter.

In other words in a microscopic examination of the current spreading layer, the particles of the wavelength conversion material are discernible as bulges of the current spreading layer. In this case, therefore, the particles are not arranged in a block made of material of the current spreading layer, rather the material of the current spreading layer reshapes the particles of the wavelength conversion material in such a way that the contour of the upper side of the current spreading layer remote from the radiation passage area is concomitantly determined by the particles of the wavelength conversion material.

In accordance with at least one embodiment of the optoelectronic semiconductor chip, the layer thickness of the current spreading layer is between 0.1 and 2.0 micrometers at least in places. The average layer thickness of the current spreading layer is preferably between 0.2 and 2.0 micrometers. Such a thin current spreading layer absorbs particularly little of the electromagnetic radiation passing through it and can nevertheless distribute the current impressed into it particularly uniformly over the entire radiation passage area.

In accordance with at least one embodiment of the optoelectronic semiconductor chip, the material of the current spreading layer wets the particles of the wavelength conversion material at least in places. Particularly preferably, particles of the wavelength conversion material are surrounded on all sides by material of the current spreading layer. That is to say that the material of the current spreading layer completely wets the particles of the wavelength conversion material. In this case, the material of the current spreading layer is situated both between a particle of the wavelength conversion material and the radiation passage area and on external areas of the particle that are remote from the radiation passage area. In other words, the particles of the wavelength conversion material are then coated with a thin layer of the material of the current spreading layer. The contour of that surface of the current spreading layer which is remote from the radiation passage area is preferably determined by the particles of the wavelength conversion material.

It is furthermore possible for the current spreading layer to comprise in places a plurality of layers of particles of the wavelength conversion material one above another. The wavelength conversion material particles are then interconnected by means of the material of the current spreading layer. The particles of the wavelength conversion material are coated for example with a thin film of the material of the current spreading layer. In this case, the degree of conversion of the current spreading layer with wavelength conversion material particles can be set, inter alia, by means of the number of layers of particles. The more layers of particles of the wavelength conversion material are applied one above another, the more complete is the conversion of the electromagnetic radiation passing through the current spreading layer.

In accordance with at least one embodiment of the optoelectronic semiconductor chip, the current spreading layer contains electrically conductive nanoparticles. By way of example, the current spreading layer contains nanoparticles doped with a doping material. The electrical conductivity of the nanoparticles is then increased or determined by the doping. In this case, the average diameter (for example measured as d50 in Q0) of the nanoparticles of the current spreading layer is preferably between at least one nanometer and a maximum of 100 nanometers, particularly preferably between at least one nanometer and a maximum of 30 nanometers.

In accordance with at least one embodiment of the optoelectronic semiconductor chip, the current spreading layer contains a sol gel material. That is to say that when the current spreading layer is applied to the radiation passage area of the optoelectronic semiconductor chip, the material of the current spreading layer is preferably in a sol state. In this case, during application to the radiation passage area, the sol comprises for example a solvent and the electrically conductive nanoparticles which are contained in the solvent. The sol furthermore preferably also contains the particles of the wavelength conversion material. After the sol has been applied to the radiation passage area, the sol is destabilized for example by extraction of the solvent to form a gel. In this way, a gel layer containing electrically conductive nanoparticles and particles of the wavelength conversion material is formed on the radiation passage area of the semiconductor chip. Thermal treatment of the gel at temperatures of between preferably 200 degrees Celsius and 400 degrees Celsius gives rise to a vitreous layer having a lower electrical sheet resistance than the original gel layer.

As a result, the radiation passage area has applied on it a layer which is suitable for current spreading, which is suitable for wavelength conversion of the electromagnetic radiation passing through it and which, on account of the particles of the wavelength conversion material incorporated into the layer, suppresses multiple total reflection of the light within the layer and thus also advantageously improves the coupling-out of light from the semiconductor chip.

Said layer preferably adheres on the radiation passage area. That is to say that the radiation passage area and current spreading layer are chosen such that after coating a gel film adheres on the body, and it resists being stripped away—for example by means of mechanical force action—at least within specific limits. That is to say, for example that the layer is not detached from the radiation passage area during further processing of the coated semiconductor chip.

In accordance with at least one embodiment of the optoelectronic semiconductor chip, the current spreading layer contains at least one of the following nanoparticles: zinc oxide nanoparticles, tin oxide nanoparticles. Further nanoparticles of so-called TCO (transparent conductive oxide) materials may also be used as nanoparticles for the current spreading layer. By way of example, the nanoparticles are doped with at least one of the following materials: boron, aluminum, gallium, indium, silicon, magnesium, cadmium.

Therefore, the current spreading layer may for example contain an aluminum-doped zinc oxide sol gel material or an indium-doped tin oxide sol gel material. Further possible metal oxides in the current spreading layer are given by the following oxides: $ZnO$, $SnO_2$, $CdSnO_3$, $In_2O_3$, $Zn_2SnO_4$, $ZnSnO_3$, $MgIn_2O_4$, $GaInO_3$, $Zn_2In_2O_5$, $In_4Sn_3O_{12}$, or mixtures.

In accordance with at least one embodiment of the optoelectronic semiconductor chip, the wavelength conversion material comprises particles of at least one of the following dyes: organic dye, inorganic dye. Preferably, the wavelength conversion material comprises particles of at least one of the following dyes: garnets doped with rare earth metals, alkaline earth metal sulfides doped with rare earth metals, thiogallates doped with rare earth metals, aluminates doped with rare earth metals, orthosilicates doped with rare earth metals, chlorosilicates doped with rare earth metals, alkaline earth metal silicon nitrides doped with rare earth metals, oxynitrides doped with rare earth metals, aluminum oxynitrides doped with rare earth metals.

The wavelength conversion material particularly preferably comprises doped garnets such as Ce- or Tb-activated garnets such as YAG:Ce, TAG:Ce, TbYAG:Ce. Examples of suitable wavelength conversion materials are specified in the documents WO 97/50123A1, WO 98/12757A1 and WO 01/08452A1, the disclosure contents of which are in this respect hereby incorporated expressly by reference.

In accordance with at least one embodiment of the optoelectronic semiconductor chip, the optoelectronic semiconductor chip is provided by one of the following semiconductor chips: photodiode chip, laser diode chip, inorganic light emitting diode chip.

If the optoelectronic semiconductor chip is a laser diode chip or a light emitting diode chip, then the current spreading layer with the wavelength conversion material is preferably applied to the radiation passage area of the chip at least in places. If the optoelectronic semiconductor chip is a photodiode chip, the current spreading layer with the wavelength conversion material is preferably applied to the radiation entrance area of the photodiode chip.

In accordance with at least one embodiment of the optoelectronic semiconductor chip, the optoelectronic semiconductor chip is provided by an organic light emitting diode chip. That is to say that the semiconductor chip contains an organic semiconductor material. In this case, it is also possible for the current spreading layer to be applied to a carrier—for example a glass substrate—and for the semiconductor body to be subsequently applied to the current spreading layer. By way of example, the material of the semiconductor body may then be applied to the current spreading layer by spinning-on, blade coating, printing or vapor deposition.

Applying a current spreading layer to a glass substrate, for example, may prove to be particularly advantageous since a heat treatment step that is possibly required for the production of the current spreading layer can be effected on said carrier. As an alternative, the current spreading layer may also be applied to the semiconductor body containing an organic semiconductor material. In this case, use is advantageously made of particularly temperature-resistant organic semiconductor materials which withstand possible heat treatment of the current spreading layer without being damaged.

An optoelectronic device comprising a semiconductor chip in accordance with at least one of the embodiments described above is furthermore specified.

In accordance with at least one embodiment, the optoelectronic device has an optoelectronic semiconductor chip in accordance with at least one of the embodiments described above and also at least two electrical connection locations via which contact can be made with the device from outside the device. Suitable designs for the optoelectronic device are described for example in the documents WO 2004/088200 and WO 02/084749, the disclosure content of which with regard to the designs is hereby incorporated by reference.

In accordance with at least one embodiment of the optoelectronic device, the device has a molded body. The molded body completely encloses the semiconductor chip for example from at least five sides. In this case, the molded body is preferably in direct contact with the above-described current spreading layer of the optoelectronic semiconductor chip at least in places.

The molded body is formed for example from a transparent encapsulant that may contain at least one of the following materials: epoxy resin, silicone resin, PMMA. The molded body may furthermore comprise a material for matching the refractive index—for example a coupling gel or an index matching gel—to an optical element disposed downstream of the semiconductor chip in the main emission direction.

The molded body is preferably transparent at least in places to the electromagnetic radiation emitted by the optoelectronic semiconductor chip. It is preferably radiation-transmissive or transparent both to the converted and to the non-converted portion of the radiation.

In accordance with at least one embodiment of the optoelectronic device, the molded body contains a wavelength conversion material. By way of example, the molded body may contain at least one of the wavelength conversion materials mentioned above. The molded body then preferably contains particles of said wavelength conversion material. In this case, the wavelength conversion may be suitable for at least partly converting electromagnetic radiation having the first wavelength or in the first wavelength range that is generated by the semiconductor chip during operation. It is furthermore possible for the wavelength conversion material in the molding composition to be suitable for converting electromagnetic radiation having the second wavelength or in the second wavelength range that has already been converted in the current spreading layer.

The wavelength conversion material of the current spreading layer may furthermore be suitable for example for converting electromagnetic radiation emitted by the optoelectronic semiconductor chip in the ultraviolet spectral range into visible light. This then also has the advantage that ageing of the material of the molded body on account of said ultraviolet radiation is reduced or prevented since said ultraviolet radiation is already converted toward higher wavelengths in the current spreading layer.

A method for producing an optoelectronic semiconductor chip in accordance with at least one of the embodiments described above is further specified.

In accordance with at least one embodiment of the method, firstly provision is made of a sol comprising electrically conductive nanoparticles—for example doped nanoparticles— and particles of a wavelength conversion material. At least one layer of said sol is applied to the surface of a body in the subsequent method step. By way of example, the sol is applied to the radiation passage area of an optoelectronic semiconductor chip. In this case, the application is preferably effected onto the radiation passage area of optoelectronic semiconductor chips which are present in the wafer assemblage. That is to say that the sol is preferably applied to a wafer comprising a plurality of optoelectronic semiconductor chips. Afterward, at least the applied layer is subjected to thermal treatment in order to convert the sol into a gel. In this case, by way of example, a solvent in which the nanoparticles and the particles of the wavelength conversion material are dissolved is at least partly extracted. In the case of coating in the wafer assemblage, it is possible, in a final method step, for the wafer to be singulated into individual optoelectronic semiconductor chips.

However, it is also possible for the sol to be applied to a carrier—for example to a glass substrate. This proves to be particularly advantageous primarily in the production of an organic light emitting diode chip.

In accordance with at least one embodiment of the method, the material is dried after the body has been coated. That is to say that at least the majority of the solvent is extracted from the sol after coating, for example by heating. During the drying process, a networklike polymerized gel arises which, in the sense of an adhesion agent, can impart an adhesion between the particles of the wavelength conversion material and the radiation passage area of the optoelectronic semiconductor chip.

In accordance with at least one embodiment of the method, the body is coated by means of one of the following coating methods: spraying, dip-coating, rotational coating, screen printing, blade coating, jet printing (inkjet printing), brushing on. In this case, it is also possible, depending on the method used, to apply the layer to the radiation passage area in patterned fashion.

In this case, the film thickness of a layer applied in this way can be set firstly by means of the parameters of the coating method chosen and secondly by means of the concentration of the sol used. The lower, for example, the concentration of the sol gel material in the solvent, the thinner the gel film produced with the same coating method.

In accordance with at least one embodiment of the method described here, the gel layer comprising the conductive nanoparticles and particles of the wavelength conversion material is subjected to an infiltration for the purpose of improving its conductivity and its optical properties. The infiltration may be effected by example for dipping into an infiltration solution at elevated temperature. For this purpose, the infiltration solution comprises for example a sol with crystallites having a very small size. It is thereby possible to set both the electrical and the optical properties of the layer in a targeted manner.

In accordance with at least one embodiment, by way of example, after the infiltration, the layer is subjected to heat treatment at temperatures of between 200 and 600 degrees Celsius, preferably between 300 and 500 degrees Celsius, particularly preferably at approximately 400 degrees Celsius. The heat treatment is preferably effected under a reducing atmosphere—for example in an $H_2/N_2$ mixture. The heat treatment gives rise to a nanocrystalline vitreous layer, and the reducing atmosphere suppresses the production of deep charge carrier traps due to oxygen at the surface and/or the grain boundaries of the current spreading layer. In this case, the heat treatment proves to be advantageous particularly for reducing the sheet resistance.

The optoelectronic semiconductor chip, the method described here for producing an optoelectronic semiconductor chip, and also the optoelectronic device described here are described in more detail below on the basis of exemplary embodiments and the associated Figures. Identical or identically acting component parts of the Figures are provided with the same reference symbols in this case. The component parts illustrated, and also the relative sizes of the component parts among one another are not to be regarded as true to scale. Rather, some details of the Figures are illustrated with an exaggerated size for the sake of better understanding.

BRIEF DESCRIPTION OF THE DRAWINGS

The optoelectronic semiconductor chip, the method described here for producing an optoelectronic semiconductor chip, and also the optoelectronic device described here are described in more detail below on the basis of exemplary embodiments and the associated Figures. Identical or identically acting component parts of the Figures are provided with the same reference symbols in this case. The component parts illustrated, and also the relative sizes of the component parts among one another are not to be regarded as true to scale. Rather, some details of the Figures are illustrated with an exaggerated size for the sake of better understanding.

DETAILED DESCRIPTION OF THE DRAWINGS

Figure 1:
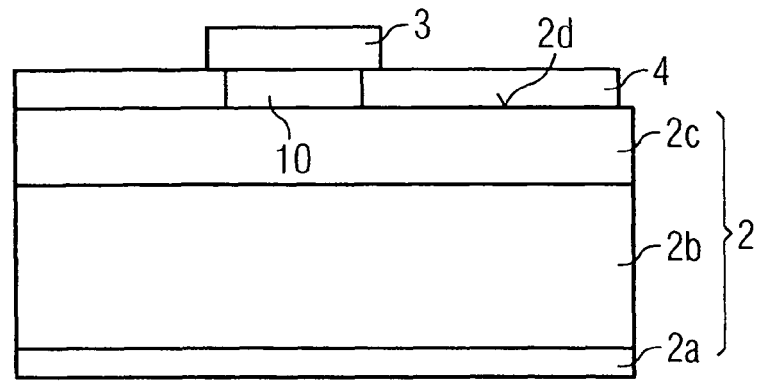
FIG. 1 shows a schematic sectional illustration of a first exemplary embodiment of the optoelectronic semiconductor chip described here.

FIG. 1 shows a schematic sectional illustration of a first exemplary embodiment of the optoelectronic semiconductor chip 2 described here. The optoelectronic semiconductor chip 2 is a light emitting diode chip, by way of example.

The optoelectronic semiconductor chip 2 has a contact layer 2a, via which electrical contact can be made with the semiconductor chip 2 from its underside. The contact layer 2a is a contact metallization, by way of example.

The optoelectronic semiconductor chip 2 furthermore has a substrate 2b. The substrate 2b is either a growth substrate onto which the active region 2c of the semiconductor chip is grown epitaxially, for example, or a carrier element to which the active region 2c is applied, for example by being bonded thereon.

The optoelectronic semiconductor chip is preferably an optoelectronic semiconductor chip 2 in which the growth substrate is at least partly removed and to whose surface remote from the original growth substrate a carrier element is applied. That is to say that the growth substrate is thinned or completely removed.

The carrier element can be chosen relatively freely compared with a growth substrate. A carrier element which is matched particularly well to the radiation-generating epitaxial layer sequence with regard to its coefficient of thermal expansion is preferably chosen. The carrier element may furthermore contain a material having particularly good thermal conductivity. In this way, the heat generated during operation by the optoelectronic semiconductor chip 2 is dissipated particularly efficiently to a carrier for example—for instance a circuit board.

Such optoelectronic semiconductor chips 2 produced by the removal of the growth substrate are often referred to as thin-film chips and are preferably distinguished by at least one of the following features:

A reflective layer or layer sequence is applied or formed at a first main area of the radiation-generating epitaxial layer sequence facing toward the carrier element, and reflects at least part of the electromagnetic radiation generated in the epitaxial layer sequence back into the latter.

The epitaxial layer sequence preferably has a thickness of a maximum of 20 µm, particularly preferably of a maximum of 10 µm.

Furthermore, the epitaxial layer sequence preferably contains at least one semiconductor layer having at least one area which has an intermixing structure. Said intermixing structure ideally leads to an approximately ergodic distribution of the light in the epitaxial layer sequence, that is to say that it has an as far as possible ergodically stochastic scattering behavior.

A basic principle of a thin-film chip is described for example in the document I. Schnitzer et al., Appl. Phys. Lett. 63(16), Oct. 18, 1993, pages 2174 to 2176, the disclosure content of which relating to the basic principle of a thin-film light emitting diode chip is hereby incorporated by reference.

In other words, the semiconductor chip 2 has a radiation passage area 2d, through which a large part of the electromagnetic radiation emitted by the optoelectronic semiconductor chip 2, for example, is coupled out. Particularly preferably, the entire radiation emitted by the optoelectronic semiconductor chip 2 emerges through the radiation passage area 2d. The radiation passage area 2d is provided for example by a part of the surface of the optoelectronic semiconductor chip 2. The radiation passage area (2d) is preferably provided by a main area of the optoelectronic semiconductor chip which is arranged for example parallel to an epitaxial layer sequence of the optoelectronic semiconductor chip 2 suitable for generating electromagnetic radiation.

For this purpose, the epitaxial layer sequence may have for example a pn junction, a double heterostructure, a single quantum well or a multiple quantum well structure (MQW). The designation quantum well structure may also encompass any structure in which charge carriers experience a quantization of their energy states as a result of confinement. In particular, the designation quantum well structure does not comprise any indication about the dimensionality of the quantization. It thus encompasses, inter alia, quantum wells, quantum wires and quantum dots and any combination of these structures. A quantization of the energy states in the quantum well structure is not absolutely necessary, however.

The active region 2c is suitable for the generation of radiation, for example. It has a radiation passage area 2d at its radiation surface remote from the substrate 2b. A current spreading layer 4 comprising a gel layer 4a and particles of a wavelength conversion material 4b is applied to the radiation passage area 2d (also see FIGS. 2A, 2B).

By way of example, the gel layer is produced from a sol with conductive nanoparticles. The layer is for example an optically transparent, nanocrystalline and electrically conductive layer, such as, for instance, a zinc oxide or tin oxide layer which may be doped with aluminum or indium, for example.

The sol contains for example a concentration of between 0.5 and a maximum of two mol of zinc oxide nanoparticles per liter of solvent. The solvent is preferably ethanol or isopropanol. The zinc oxide nanocrystals in the sol preferably have particle diameters of between 3 and 30 nanometers. The preparation of a ZnO sol is thoroughly described in the document "Lubomir Spanhel and Marc A. Anderson, Semiconductor Clusters in the Sol-Gel Process: Quantized Aggregation, Gelation, and Crystal Growth in Concentrated ZnO Colloids, J. Am. Chem. Soc. 1991, 113, 2826-2833" in the section "Experimental section", which, relating to the preparation of the sol, is hereby incorporated by reference. The zinc oxide sol is preferably doped with aluminum or gallium.

The doping material can be introduced into the nanocrystals of the sol for example by co-condensation with the sol precursor, preferably a corresponding metal alkoxide. However, it can also be mixed with the finished sol after condensation of the precursor.

In this case, the sol gel materials may be distinguished by the following advantages: they have a high oxidation and UV resistance, and also wet-or dry-chemical etchability, and numerous, for example solvent-based, coating techniques are available for applying the sol layer.

By way of example, the particles 4b are particles of a wavelength conversion material as described further above. Phosphor particles from the group of phosphors having the general formula $A_3B_5X_{12}$:M are particularly preferably involved. In this case, the particles have an average diameter b (for example measured as d50 in Q0) of three to 20 micrometers, preferably a maximum of five micrometers, particularly preferably between one and two micrometers. The particles are particularly preferably YAG:Ce particles.

The wavelength conversion material particles 4b are particularly well suited to converting electromagnetic radiation generated by the light emitting diode chip 2 in the blue spectral range—with a maximum of the intensity of the emitted radiation between 430 nanometers and 450 nanometers—into yellow light. By mixing the, for example, blue light emitted by the semiconductor chip 2 with the yellow light re-emitted by the wavelength conversion material, white light arises in this way.

The material 4 preferably has approximately 40 percent by volume of wavelength conversion material particles.

The material 4 is applied to the optoelectronic semiconductor chip—preferably in the wafer assemblage—by means of one of the following coating methods: spraying, dip-coating, rotational coating, screen printing, blade coating, jet printing, brushing on. In this case, the sol gel material is preferably in its sol state during the coating operation.

As an alternative to an application of the material which already contains a wavelength conversion material, it is also possible for the wavelength conversion material particles not to be applied until after the coating of the wafer with the sol. By way of example, the wafer assemblage coated with sol material can then be dusted or sprayed with a powder comprising the wavelength conversion material. In this way, too, the sol gel material serves as an adhesion agent for the wavelength conversion material particles on the radiation exit area 2d of the optoelectronic semiconductor chip 2.

The layer thickness of the layer 4 can be set firstly by means of the parameters of the coating technique used and secondly by means of the concentration of the sol.

After coating, the material 4 is dried. For this purpose, the arrangement is heated for example for a specific time to temperatures of between 90 and 150 degrees Celsius, preferably to 100 degrees Celsius. The drying operation is concluded when at least the majority of the solvent has escaped from the sol gel material. The sol is then dried to form a relatively solid gel.

A connection location 3, for example a bonding pad, is subsequently applied to the current spreading layer 4. Electrical contact can be made with the optoelectronic semiconductor chip 2 via the bonding pad, and the current spreading layer distributes the electric current impressed in this way over the entire radiation passage area 2d of the semiconductor chip 2. An electrical insulation region 10 may be arranged directly beneath the connection location 3, said region suppressing generation of radiation directly beneath the connection location 3.

It is furthermore possible for the layer 4 to be subjected to heat treatment after the coating of the optoelectronic semiconductor chip and drying for the purpose of electrical activation. It is preferred for the layer 4 to be subjected to heat treatment at temperatures of between 200 and 600 degrees Celsius, preferably between 300 and 500 degrees Celsius. The heat treatment is preferably effected under a reducing atmosphere—for example in an $H_2/N_2$ mixture. The heat treatment gives rise to a nanocrystalline vitreous layer. The reducing atmosphere suppresses the production of deep charge carrier traps due to oxygen at the surface and/or the grain boundaries of the current spreading layer. In this case, the heat treatment proves to be advantageous particularly for reducing the sheet resistance.

If the current spreading layer 4 is an aluminum-doped zinc oxide, the heat treatment preferably takes place at approximately 400 degrees Celsius under a reducing atmosphere. An infiltration—preceding the heat treatment—of the layer with corresponding sol having a very small crystallite size or with the precursor thereof can also improve the electrical conductivity of the current spreading layer 4. The infiltration of an aluminum-doped zinc oxide layer is described in the document EP 0877099, for example, the disclosure content of which in this regard is hereby incorporated by reference.

Figure 2A:
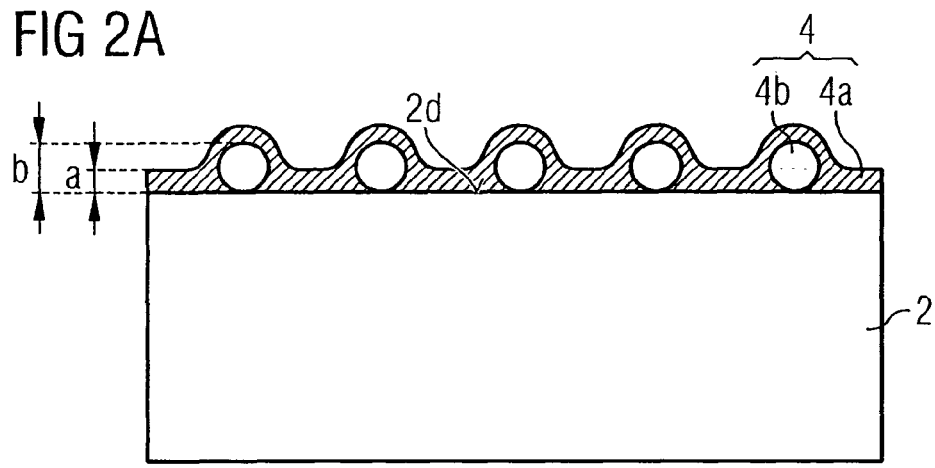
FIG. 2A shows a schematic sectional illustration of a second exemplary embodiment of the optoelectronic semiconductor chip described here.

FIG. 2A shows a schematic sectional illustration of a second exemplary embodiment of the optoelectronic semiconductor chip 2 described here. The optoelectronic semiconductor chip 2 is a light emitting diode chip, for example.

The microscopic examination, as indicated schematically in FIG. 2A, clearly reveals the contours of the wavelength conversion material particles 4b in the current spreading layer 4. The sol gel material 4a may be situated both between radiation exit area 2d and particles 4b and also on the particles 4b. The sol gel material 4a thereby imparts an adhesion between the radiation exit area 2d and the particles of the wavelength conversion material 4b. It is furthermore possible in this way for the electrically conductive nanoparticles of the sol gel material 4a to conduct current from the upper side of the current spreading layer 4 to the radiation passage area 2d of the optoelectronic semiconductor chip 2. The sol gel material 4a is preferably chosen such that it is at least for the most part transparent both to the electromagnetic radiation generated by the light emitting diode chip 2 and to the electromagnetic radiation re-emitted by the wavelength conversion material particles.

It is furthermore possible for the wavelength conversion material to comprise a plurality of different conversion materials. Thus, the wavelength conversion material may be composed for example of particles which convert blue light into yellow light and particles which convert blue light into red light. White light generated as a result is distinguished by a particularly good color rendering value.

Figure 2B:
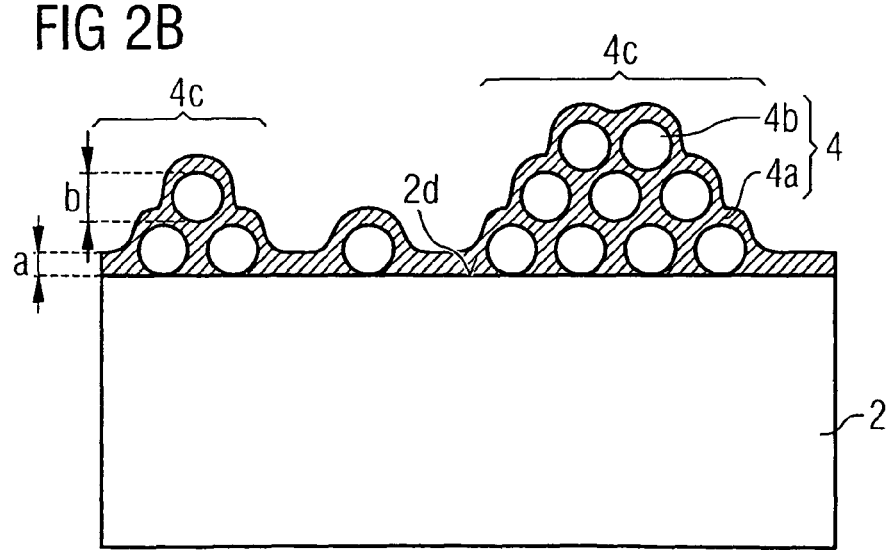
FIG. 2B shows a schematic sectional illustration of a third exemplary embodiment of the optoelectronic semiconductor chip described here.

FIG. 2B shows a schematic sectional illustration in a microscopic examination of a third exemplary embodiment of the optoelectronic semiconductor chip described here.

As in the exemplary embodiment of FIG. 2A, in this case, too, a large part of the electromagnetic radiation generated in the optoelectronic semiconductor chip 2 is coupled out through the radiation passage area 2d.

The radiation passage area 2d is coated with the current spreading layer 4 at least in places. The current spreading layer 4 comprises a sol gel material 4a, containing electrically conductive nanoparticles, and particles of a wavelength conversion material 4b.

The average layer thickness a of the current spreading layer 4a is preferably between 0.5 micrometer and two micrometers. The average particle diameter b (for example measured as d50 in Q0) of the wavelength conversion material particles is preferably between one and five micrometers.

As can be gathered from the microscopic examination in FIG. 2B, wavelength conversion material particles 4b may be arranged one above another in the exemplary embodiment described. In this way, a plurality of layers 4c of wavelength conversion material particles 4b may be arranged on the radiation passage area 2d. Sol gel material 4a at least partly coats wavelength conversion material particles 4b both within the layers 4c and at the outer edge of the layers 4c. In this case, within the layers 4c as well, the average layer thickness a of the sol gel material 4a is preferably less than the average particle diameter b of the wavelength conversion material particles 4b. In this exemplary embodiment, too, the contours of the outer particles 4b of the layers 4c are clearly discernible in the current spreading layer 4.

Figure 3:
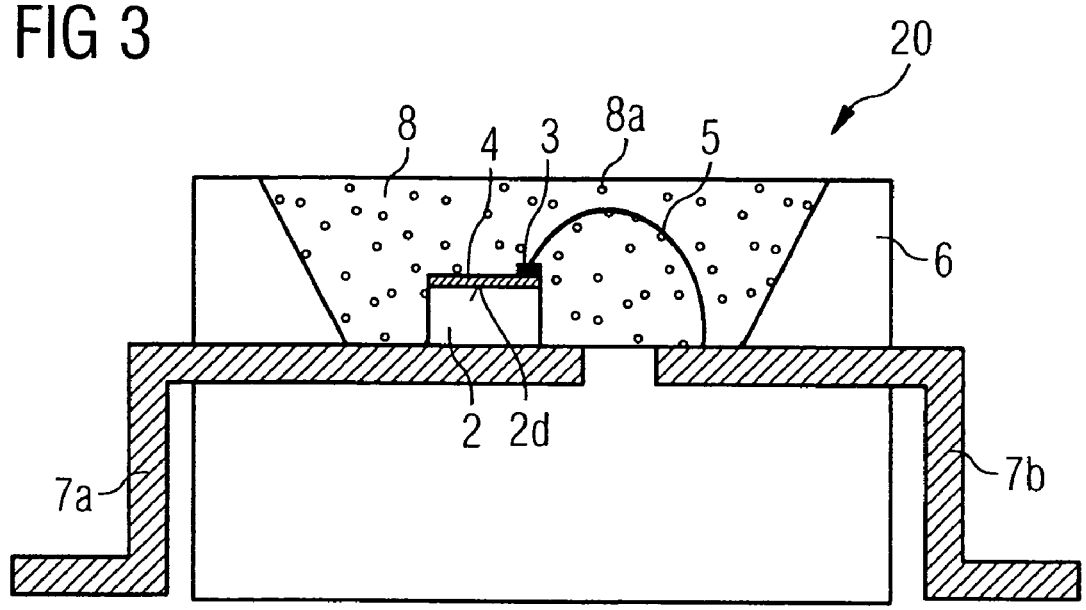
FIG. 3 shows a schematic sectional illustration of an exemplary embodiment of the optoelectronic device described here.

FIG. 3 shows an optoelectronic device comprising an optoelectronic semiconductor chip described above. The device is a light emitting diode 20, for example.

The light emitting diode 20 contains a light emitting diode chip 2, the radiation passage area 2d of which is coated with a current spreading layer 4 containing a sol gel material 4a and particles of a wavelength conversion material 4b. In one corner, for example, a bonding pad 3 is applied to the current spreading layer 4, via which bonding pad contact is made with the light emitting diode chip by means of a bonding wire 5. The current spreading layer 4 distributes the electromagnetic current impressed in this way from the bonding pad 3 over the entire radiation passage area 2d of the semiconductor chip 2.

The semiconductor 2 is connected by its surface opposite the radiation exit area 2d to a first connection part 7a in an electrically conductive and mechanically stable manner. A wire bonding wire 5 electrically connects the optoelectronic semiconductor chip to a second electrical connection part 7b.

The optoelectronic semiconductor chip 2 is arranged in the cutout of a housing 6, the inner walls of which may be configured to be reflective, for example. The cutout may furthermore contain an encapsulant 8 that is transparent at least to the electromagnetic radiation generated by the light emitting diode chip 2 and the electromagnetic radiation re-emitted by the wavelength conversion material. The encapsulant 8 is for example an epoxy resin, a silicone resin, an epoxide-silicone hybrid material, PMMA and/or an index matching gel. It is also possible, moreover, for the cutout to be filled with an encapsulant 8 comprising a sol gel material, for example based on silicon dioxide.

Furthermore, the encapsulant 8 may comprise particles of a wavelength conversion material 8a. These may be particles of the wavelength conversion materials described further above.

Figure 4:
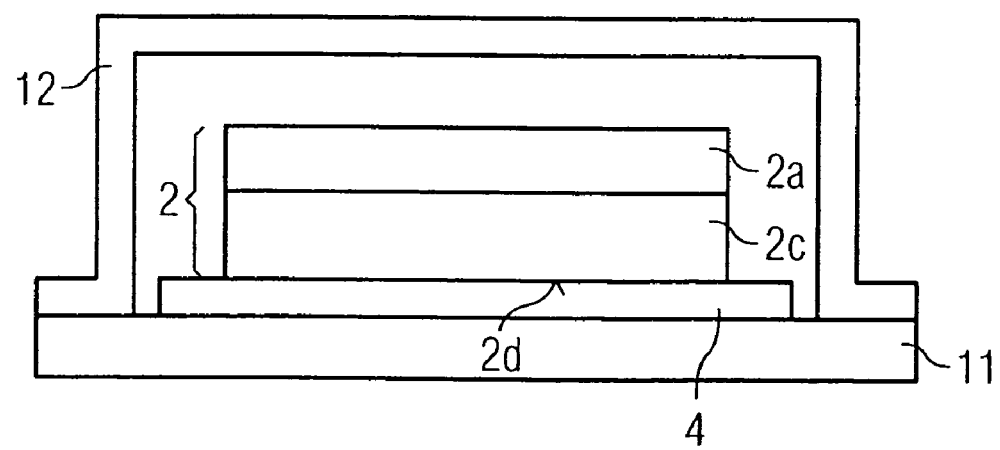
FIG. 4 shows a schematic sectional illustration of a second exemplary embodiment of the optoelectronic device described here.

FIG. 4 shows a schematic sectional illustration of a second exemplary embodiment of the optoelectronic device described here.

The device described in connection with FIG. 4 is an organic light emitting diode. In this case, the current spreading layer 4 is in contact with a substrate 11. By way of example, the current spreading layer 4 is applied to the substrate 11 and produced in the manner described above. As an alternative, it is also possible for the current spreading layer 4 to be applied on the semiconductor body 2. In this case, the semiconductor body 2 contains particularly thermostable organic materials.

The substrate 11 is preferably a glass plate or a plate which contains a transparent plastic. In this case, it is also possible for the substrate 1 to be flexible and to be formed for example as a film.

The active region 2c of the organic semiconductor chip comprises for example small organic molecules or an organic polymer material. The active region may furthermore comprise hole conducting and electron conducting layers.

A contact layer 2a is situated on that side of the semiconductor body 2 which is remote from the radiation passage area 2d. The contact layer 2a functions for example as a cathode of the organic light emitting diode. For this purpose, the contact layer 2a preferably has a low work function for electrons. By way of example, the contact layer 2a comprises one of the following materials or contains one of the following materials: Ca, Ba, Al, Ag.

The current spreading layer 4 preferably constitutes the anode of the organic light emitting diode. For this purpose, it has a high work function for electrons. The current spreading layer 4 contains—as described further above—particles comprising a wavelength conversion material.

In the active region 2c, for example electromagnetic radiation from the ultraviolet and/or blue spectral range is generated, which is completely or partly converted into electromagnetic radiation having a different wavelength or in a different wavelength range by the wavelength conversion material in the current spreading layer 4.

The optoelectronic device shown in FIG. 4 furthermore has an encapsulation 12. The encapsulation 12 may be provided for example by a plastic material, by glass or a metal.

The invention is not restricted by the description on the basis of the exemplary embodiments. Rather, the invention encompasses any new feature and also any combination of features, which comprises in particular any combination of features in the patent claims, even if this feature or this combination of features is itself not explicitly specified in the patent claims or exemplary embodiments.

I claim:

1. An optoelectronic semiconductor chip, comprising:
    a semiconductor body comprising an active zone in which radiation is generated during operation of the optoelectronic semiconductor chip and a radiation passage area through which radiation generated in the active zone exits the semiconductor body;
    wherein the radiation passage area is in contact with a current spreading layer, the current spreading layer containing particles comprising a wavelength conversion material;
    wherein particles of the wavelength conversion material have an average diameter that is greater than the average layer thickness of the current spreading layer; and
    wherein the current spreading layer comprises a material that completely wets at least one particle of the wavelength conversion material such that said at least one particle is completely surrounded by said material.

2. The optoelectronic semiconductor chip as claimed in claim 1, wherein the current spreading layer imparts an adhesion between the particles of the wavelength conversion material and the radiation passage area, and wherein the material of the current spreading layer is arranged between the particles of the wavelength conversion material and the radiation passage area.

3. The optoelectronic semiconductor chip as claimed in claim 1, wherein the average layer thickness of the current spreading layer is between 0.2 and 2.0 μm.

4. The optoelectronic semiconductor chip as claimed in claim 1, wherein the current spreading layer contains doped nanoparticles.

5. The optoelectronic semiconductor chip as claimed in claim 1, wherein the material of the current spreading layer is a sol gel material.

6. The optoelectronic semiconductor chip as claimed in claim 1, wherein the current spreading layer contains at least one of the following nanoparticles:
    zinc oxide, tin oxide.

7. The optoelectronic semiconductor chip as claimed in claim 1, wherein the current spreading layer contains nanoparticles doped with at least one of the following materials: boron, aluminum, gallium, indium, silicon, magnesium.

8. The optoelectronic semiconductor chip as claimed in claim 1, wherein the material of the current spreading layer is an aluminum-doped zinc oxide sol gel material.

9. The optoelectronic semiconductor chip as claimed in claim 1, wherein the material of the current spreading layer is an indium-doped zinc oxide sol gel material.

10. The optoelectronic semiconductor chip as claimed in claim 1, wherein the wavelength conversion material comprises particles of at least one of the following dyes: an organic dye or an inorganic dye.

11. The optoelectronic semiconductor chip as claimed in claim 1,
wherein the wavelength conversion material comprises particles of at least one of the following dyes: garnets doped with rare earth metals, alkaline earth metal sulfides doped with rare earth metals, thiogallates doped with rare earth metals, aluminates doped with rare earth metals, orthosilicates doped with rare earth metals, chlorosilicates doped with rare earth metals, alkaline earth metal silicon nitrides doped with rare earth metals, oxynitrides doped with rare earth metals and aluminum oxynitrides doped with rare earth metals.

12. The optoelectronic semiconductor chip as claimed in claim 1, wherein the wavelength conversion material comprises particles of at least one of the following doped garnets: YAG:Ce, TAG:Ce, TbYAG:Ce.

13. The optoelectronic semiconductor chip as claimed in claim 1, wherein the optoelectronic semiconductor chip comprises one of the following semiconductor chips: a photodiode chip, a laser diode chip or an inorganic light emitting diode chip.

14. The optoelectronic semiconductor chip as claimed in claim 1, wherein the optoelectronic semiconductor chip comprises an organic light emitting diode chip.

15. The optoelectronic semiconductor chip as claimed in claim 1, wherein the material of the current spreading layer contains a sol gel material and a contour of that surface of the current spreading layer which is remote from a radiation passage area is determined by the particles of the wavelength conversion material.

16. The optoelectronic semiconductor chip as claimed in claim 1, wherein substantially each particle of the wavelength conversion material is completely wetted by the material of the current spreading layer, such that substantially each particle of the wavelength conversion materially is completely surrounded by said wavelength conversion material.

* * * * *